United States Patent
Kuang et al.

(10) Patent No.: US 12,099,377 B2
(45) Date of Patent: Sep. 24, 2024

(54) CLOCK SKEW-ADJUSTABLE CHIP CLOCK ARCHITECTURE OF PROGRAMMABLE LOGIC CHIP

(71) Applicant: WUXI ESIONTECH CO., LTD., Wuxi (CN)

(72) Inventors: Chenguang Kuang, Wuxi (CN); Yanfei Zhang, Wuxi (CN); Boyin Chen, Wuxi (CN); Jicong Fan, Wuxi (CN)

(73) Assignee: WUXI ESIONTECH CO., LTD., Wuxi (CN)

( * ) Notice: Subject to any disclaimer, the term of this patent is extended or adjusted under 35 U.S.C. 154(b) by 167 days.

(21) Appl. No.: 17/955,581

(22) Filed: Sep. 29, 2022

(65) Prior Publication Data

US 2023/0016311 A1    Jan. 19, 2023

Related U.S. Application Data

(63) Continuation of application No. PCT/CN2022/102672, filed on Jun. 30, 2022.

(30) Foreign Application Priority Data

Dec. 3, 2021 (CN) .......................... 202111470014.6

(51) Int. Cl.
*G06F 1/08* (2006.01)
*G06F 1/10* (2006.01)
*G06F 30/396* (2020.01)

(52) U.S. Cl.
CPC .................. *G06F 1/08* (2013.01); *G06F 1/10* (2013.01); *G06F 30/396* (2020.01)

(58) Field of Classification Search
None
See application file for complete search history.

(56) References Cited

U.S. PATENT DOCUMENTS

| | | | | |
|---|---|---|---|---|
| 6,049,883 A | * | 4/2000 | Tjandrasuwita | .......... G06F 1/10 713/322 |
| 7,535,271 B2 | * | 5/2009 | Kizer | .................... H03L 7/0805 327/156 |

(Continued)

FOREIGN PATENT DOCUMENTS

| | | |
|---|---|---|
| CN | 102171763 A | 8/2011 |
| CN | 103389952 A | 11/2013 |

(Continued)

*Primary Examiner* — Paul Yen
(74) *Attorney, Agent, or Firm* — Bayramoglu Law Offices LLC (57) ABSTRACT

A delay adjustment cell is disposed in a channel of at least one regional clock of a chip clock architecture, and the delay adjustment cell includes a plurality of parallel delay paths with different delay values. The delay adjustment cell gates one of the delay paths based on an obtained configuration signal such that a connected regional clock has a corresponding target delay, and a target delay of each regional clock corresponds to a clock skew mode of the programmable logic chip. A clock skew between different regional clocks is adjusted by controlling the gated delay path in the delay adjustment cell, such that a clock skew of the chip can be adjusted in a relatively large range. Under the same resource configuration, different path choices of the delay adjustment cell lead to different clock skews to meet different clock skew modes in different application scenarios.

9 Claims, 4 Drawing Sheets

(56) References Cited

U.S. PATENT DOCUMENTS

| | | | |
|---|---|---|---|
| 2004/0095988 A1* | 5/2004 | Kim | H04B 15/02 |
| | | | 375/130 |
| 2008/0141061 A1 | 6/2008 | Chan et al. | |
| 2010/0117705 A1 | 5/2010 | Nomura | |
| 2013/0305078 A1* | 11/2013 | Lee | G06F 1/08 |
| | | | 713/500 |
| 2017/0346393 A1* | 11/2017 | Chang | H01L 23/5252 |

FOREIGN PATENT DOCUMENTS

| | | |
|---|---|---|
| CN | 105786087 A | 7/2016 |
| CN | 107453736 A | 12/2017 |
| CN | 114167943 A | 3/2022 |
| JP | H08274602 A | 10/1996 |

\* cited by examiner

FIG. 1

(PRIOR ART)

CLOCK SKEW-ADJUSTABLE CHIP CLOCK ARCHITECTURE OF PROGRAMMABLE LOGIC CHIP

CROSS REFERENCES OF THE RELATED APPLICATIONS

The present application is a Continuation Application of PCT/CN2022/102672 filed on Jun. 30, 2022, which is further based upon and claims priority to Chinese Patent Application No. 202111470014.6, filed on Dec. 3, 2021, the entire contents of which are hereby incorporated by reference.

TECHNICAL FIELD

The present disclosure relates to the field of clock design, and in particular, to a clock skew-adjustable chip clock architecture of a programmable logic chip.

BACKGROUND

Figure 1:
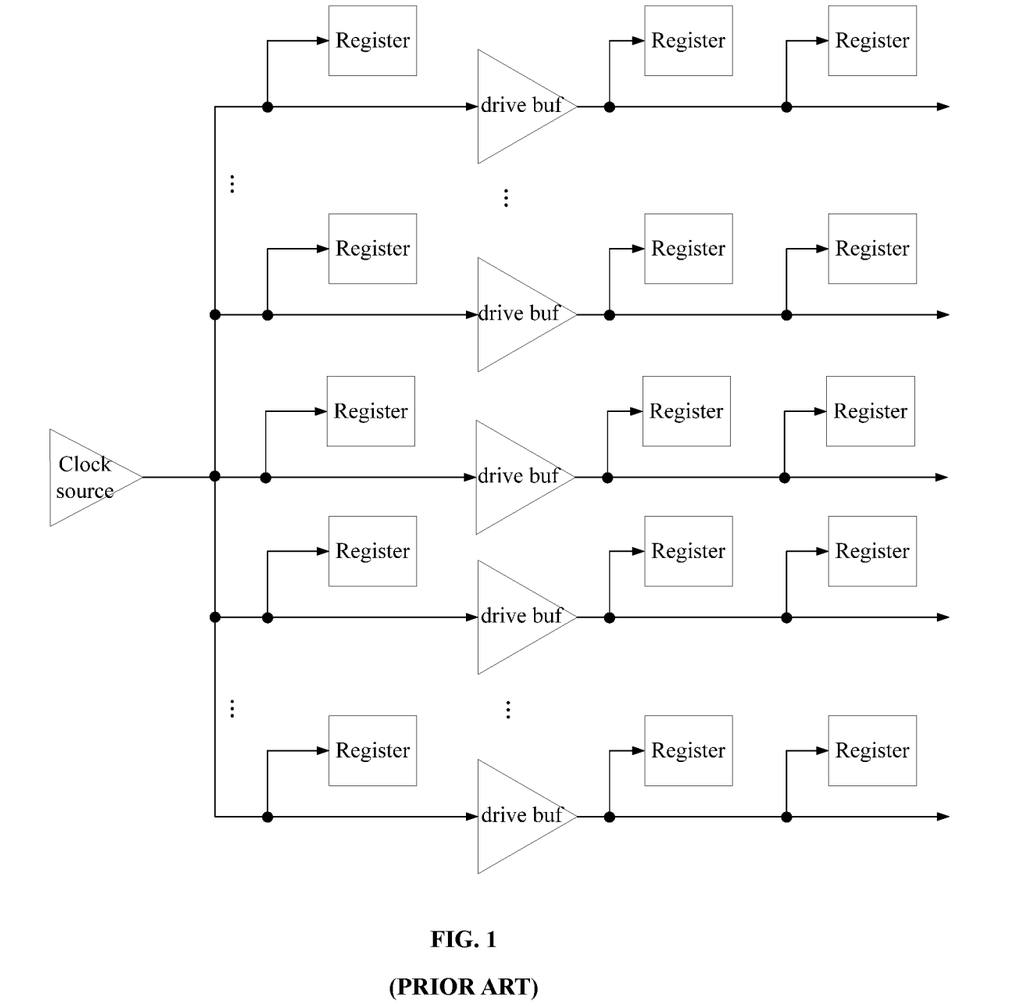
FIG. 1 is a schematic structural diagram of an existing fishbone-type clock architecture.

A clock tree is often used in the design of a programmable logic chip. The current clock tree structure of the programmable logic chip supports hierarchical clock design and usually adopts fishbone-type wiring to realize a clock structure. As shown in FIG. 1, this structure is simple, significantly hierarchical, and fits well with programmable resources.

Achieving a small clock skew, which is an important index, is the purpose of clock tree design, but existing fishbone-type clock architecture has a large clock skew, which affects overall performance. In addition, the clock skew increases as the size of the programmable logic chip increases. When clock regions in the programmable logic chip increase to a certain quantity, the clock skew increases to an unacceptable value. Although the clock tree synthesis technology of a general application-specific integrated circuit (ASIC) can reduce the clock skew, the clock tree synthesis technology cannot be integrated with other programmable logic units because a clock hierarchy, blocking, layout, and wiring are not planned in advance. In this case, it is difficult to use the clock tree synthesis technology to carry out the layout and wiring of the clock and programmable design of clock resources according to the design. Therefore, the clock tree synthesis technology of the ASIC cannot be applied to the clock tree design of the programmable logic chip to optimize the clock skew.

An existing fishbone-type clock architecture has a large clock skew, which affects overall performance. Although a clock tree synthesis technology of a general ASIC can reduce the clock skew, the clock tree synthesis technology cannot be applied to the clock tree design of a programmable logic chip to optimize the clock skew.

SUMMARY

To resolve the above problems and meet the above technical requirements, the inventor proposed a clock skew-adjustable chip clock architecture of a programmable logic chip. The technical solutions of the present disclosure are as follows:

A clock skew-adjustable chip clock architecture of a programmable logic chip includes a global clock and a plurality of regional clocks. A clock input terminal of the global clock is connected to a clock source. A clock output terminal of the global clock is separately connected to a clock input terminal of each of the regional clocks. Each of the regional clocks is connected to a clock load of a corresponding chip region of the regional clock and provides a clock signal.

A delay adjustment cell is disposed in a channel of at least one of the regional clocks. The delay adjustment cell includes a plurality of parallel delay paths with different delay values. The delay adjustment cell gates one of the delay paths based on an obtained configuration signal, such that a connected regional clock has a corresponding target delay, and a target delay of each of the regional clocks corresponds to a clock skew mode of the programmable logic chip.

As a further technical solution, the clock skew mode of the programmable logic chip includes at least one of a zero-skew mode, a lead skew mode, and a lag skew mode.

The zero-skew mode is a clock skew mode in which phases of clock signals of all clock loads with different distances from the clock source are the same. The lead skew mode is a clock skew mode in which a clock signal of a clock load that is farther away from the clock source has a larger leading phase. The lag skew mode is a clock skew mode in which a clock signal of a clock load that is farther away from the clock source has a larger lagging phase.

As a further technical solution, the delay adjustment cell parses an externally input configuration code stream of the programmable logic chip to obtain the configuration signal, or the chip clock architecture further includes a configuration signal generation unit implemented by a resource in the programmable logic chip, where the configuration signal generation unit generates the configuration signal corresponding to the clock skew mode of the programmable logic chip and provides the configuration signal to the delay adjustment cell.

As a further technical solution, based on a layout position of a clock load in each chip region and a clock signal obtained by the clock load, as well as the target delay of the corresponding regional clock, the configuration signal generation unit generates the configuration signal for the delay adjustment cell connected to the regional clock.

As a further technical solution, the delay adjustment cell further includes an enable terminal and gates one of the delay paths based on the obtained configuration signal when receiving an enable signal with a valid level or turns off all the delay paths when receiving an enable signal with an invalid level.

The enable signal of the delay adjustment cell has a valid level when a resource of a chip region corresponding to the regional clock connected to the delay adjustment cell is used and has an invalid level when the resource of the chip region corresponding to the regional clock connected to the delay adjustment cell is not used.

As a further technical solution, any $i^{th}$ delay path of one delay adjustment cell includes one gating buffer and i delay buffers, which are cascaded, where i is a parameter and its start value is 0. The delay adjustment cell controls, based on the obtained configuration signal, one gating buffer to be turned on and the other gating buffers to be turned off to gate a delay path in which the gating buffer that is turned on is located.

As a further technical solution, a delay change value of an $(i+1)^{th}$ delay path relative to the $i^{th}$ delay path is a delay value generated by one delay buffer, and delay values generated by all delay buffers in the delay adjustment cell are equal and consistent with a delay value $T_{RE}$ of the global clock between two adjacent different chip regions.

As a further technical solution, the global clock is a vertically wired longitudinal clock. Each of the regional clocks is a horizontally wired transverse clock. The delay value $T_{RE}$ of the global clock between the two adjacent different chip regions is a delay value of the global clock in a longitudinal height of a chip region corresponding to one regional clock. If longitudinal heights of chip regions corresponding to the regional clocks are the same, delay values generated by all single delay buffers in all delay adjustment cells are equal.

As a further technical solution, any two delay adjustment cells include the same quantity or different quantities of delay paths, and combinations of all delay values generated by any two delay adjustment cells are the same or different.

As a further technical solution, the global clock is connected to the regional clock by using the delay adjustment cell, and the global clock is connected to at least one of the regional clocks by using a plurality of cascaded delay adjustment cells.

The present disclosure provides a clock skew-adjustable chip clock architecture of a programmable logic chip. In the chip clock architecture, a delay adjustment cell containing a plurality of parallel delay paths with different delay values is used to gate a corresponding delay path, such that a connected regional clock has a different delay to adjust a clock skew between different regional clocks. In this way, a clock skew of the chip can be adjusted in a relatively large range. Under the same resource configuration, different path choices of the delay adjustment cell also lead to different clock skews to meet different clock skew modes in different application scenarios.

DETAILED DESCRIPTION OF THE EMBODIMENTS

The specific implementations of the present disclosure will be further described below with reference to the accompanying drawings.

Figure 2:
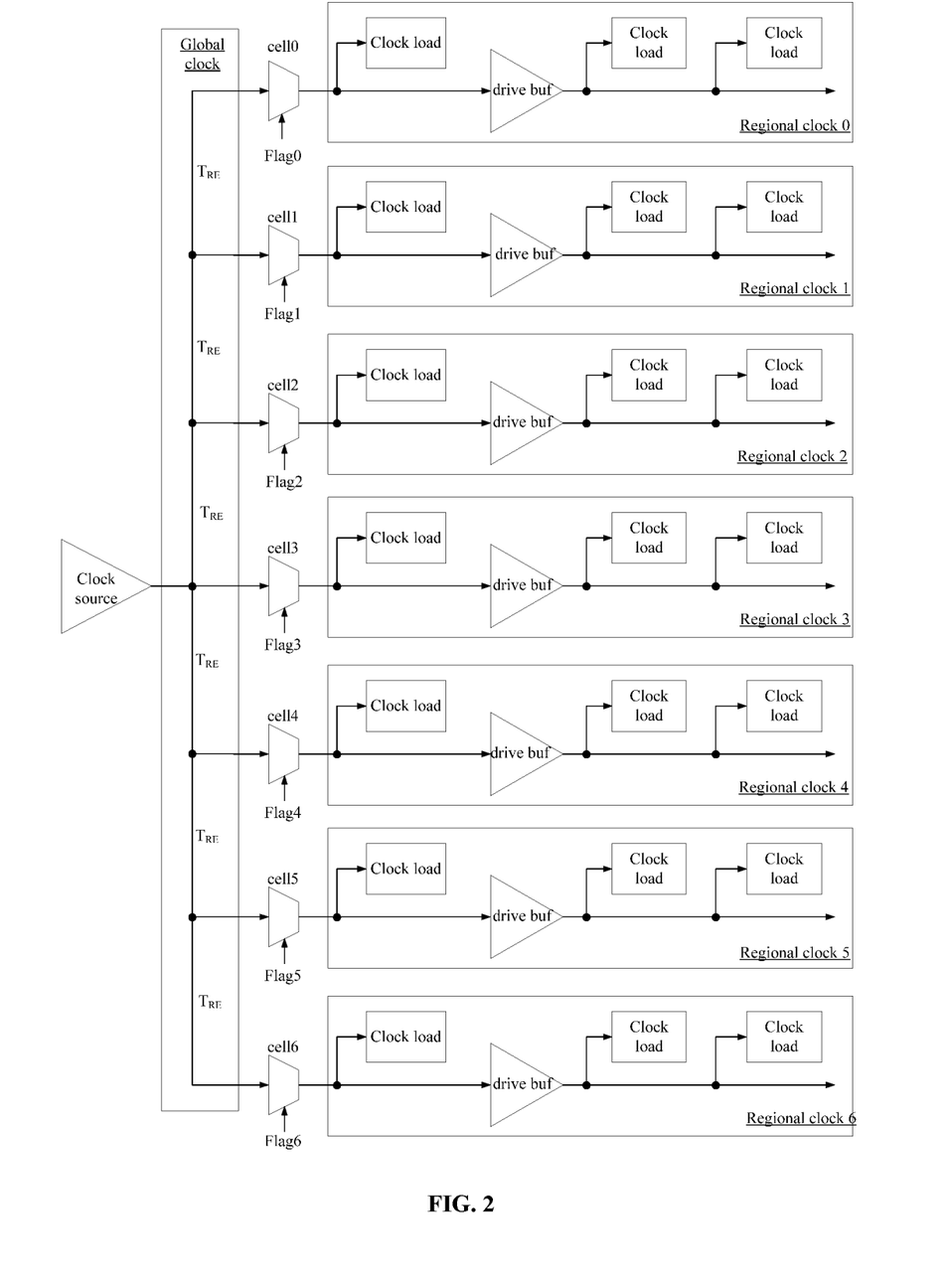
FIG. 2 is a schematic structural diagram of a chip clock architecture according to the present disclosure.

The present disclosure provides a clock skew-adjustable chip clock architecture of a programmable logic chip. As shown in FIG. 2, the chip clock architecture includes a global clock and a plurality of regional clocks, where a clock input terminal of the global clock is connected to a clock source (root clk). A clock output terminal of the global clock is separately connected to a clock input terminal of each of the regional clocks. Each of the regional clocks is connected to a clock load of a corresponding chip region of the regional clock and provides a clock signal. The clock load is a resource that requires the clock signal inside the programmable logic chip, such as a register. Optionally, in an embodiment, the global clock is a vertically wired longitudinal clock, and each of the regional clocks is a horizontally wired transverse clock. In another embodiment, as shown in FIG. 2, each of the regional clocks is implemented by a unidirectional fishbone-type structure.

A delay adjustment cell is disposed in a channel of at least one of the regional clocks. Optionally, the delay adjustment cell is separately disposed in channels of all of the regional clocks, or the delay adjustment cell is separately disposed in channels of some of the regional clocks. FIG. 2 shows an example in which there are seven regional clocks, and the delay adjustment cell is separately disposed in the channels of the seven regional clocks. The seven delay adjustment cells are denoted as cell 0 to cell 6, respectively. In an embodiment, the global clock is connected to the regional clock by using the delay adjustment cell, in other words, the delay adjustment cell is disposed at a junction between the global clock and the regional clock. This is taken as an example later in the present disclosure. In another embodiment, the delay adjustment cell is disposed at another position in the channel of the regional clock based on a different application requirement.

Figure 3:
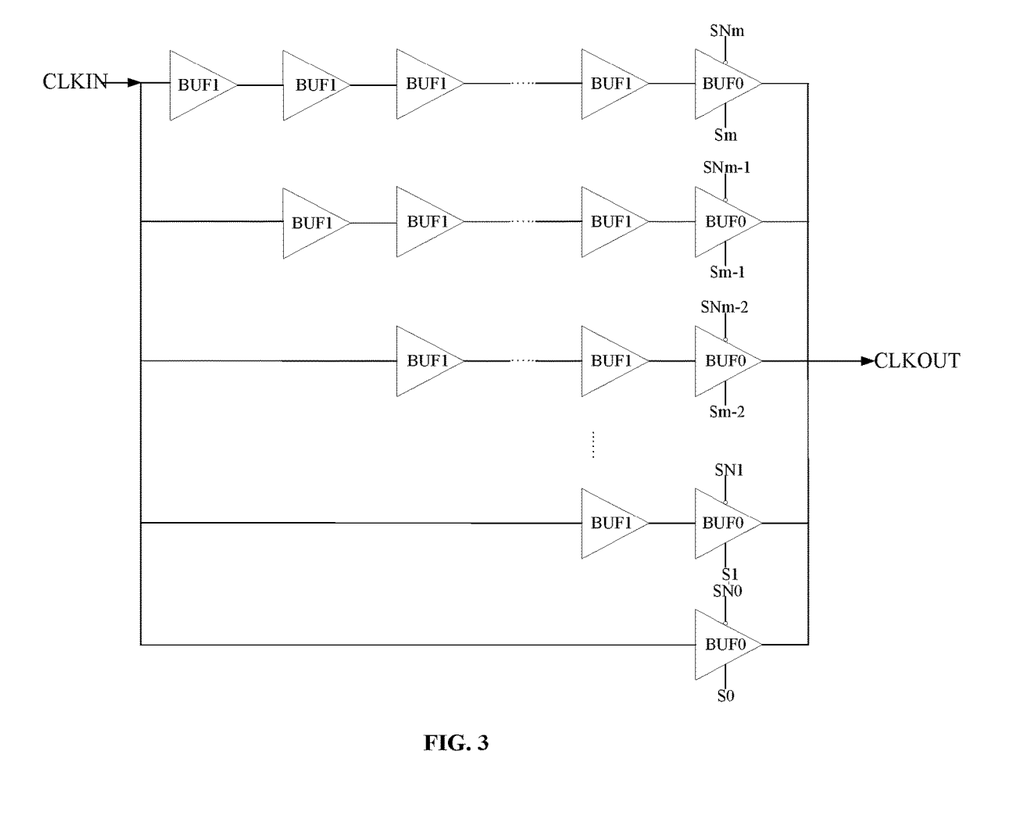
FIG. 3 is an internal schematic structural diagram of a delay adjustment cell.

The delay adjustment cell includes a plurality of parallel delay paths with different delay values. As shown in FIG. 3, any $i^{th}$ delay path of one delay adjustment cell includes one gating buffer BUF0 and i delay buffers BUF1, which are cascaded, where i is a parameter and its start value is 0. Therefore, one delay buffer BUF1 is added for an $(i+1)^{th}$ delay path relative to the $i^{th}$ delay path, and an increase of a delay value is a delay value generated by the added delay buffer BUF1. Delay values generated by any two delay buffers BUF1 in the delay adjustment cell are equal or different. In an embodiment, delay values generated by all delay buffers BUF1 in the delay adjustment cell are equal, such that a delay value change of any $(i+1)^{th}$ delay path relative to the $i^{th}$ delay path is the same. Therefore, the delay adjustment cell generates a combination of a plurality of delay values with equal changes in difference.

Further, in another embodiment, a delay value of each delay buffer BUF1 in the delay adjustment cell is consistent with a delay value $T_{RE}$ of the global clock between two adjacent different chip regions to achieve a good adjustment effect of a clock skew. As shown in FIG. 2, in an architecture in which the global clock is the longitudinal clock and the regional clock is the transverse clock, the delay value $T_{RE}$ of the global clock between the two adjacent different chip regions is a delay value of the global clock in a longitudinal height of a chip region corresponding to one regional clock. In addition, for easy expansion, longitudinal heights of chip regions corresponding to the regional clocks are the same. Therefore, the delay value $T_{RE}$ of the global clock between any two adjacent different chip regions is the same.

Positions of different delay adjustment cells in the channel of the regional clock may be the same or different. Generally, delay values generated by all single delay buffers in all delay adjustment cells are equal. Each delay adjustment cell is of a structure shown in FIG. 3. Any two delay adjustment cells include the same quantity or different quantities of delay paths, and combinations of all delay values generated by any two delay adjustment cells are the same or different.

Each delay adjustment cell receives a configuration signal, and the configuration signals are denoted as flag 0 to flag 6, respectively, as shown in FIG. 2. In a working process of the chip clock architecture, the delay adjustment cell gates one of the delay paths based on the obtained configuration signal, such that a connected regional clock has a corresponding target delay. Specifically, the delay adjustment cell controls, based on the obtained configuration signal, one gating buffer BUF0 to be turned on and the other gating buffers BUF0 to be turned off to gate a delay path in which the gating buffer BUF0 that is turned on is located. As shown in FIG. 3, the configuration signal specifically includes an S signal and an SN signal of each gating buffer. When there are too many configuration bits or too many regions in the configuration signal, in order to save configuration resources, the delay adjustment cells may alternatively be connected in series and then cascaded, which takes up fewer configuration resources while achieving the same effect. In other words, the global clock is connected to at least one of the regional clocks by using a plurality of cascaded delay adjustment cells.

Therefore, a delay of the regional clock in the chip region can be adjusted by using the delay adjustment cell based on actual needs to achieve the desired target delay. A target delay of each of the regional clocks corresponds to a clock skew mode of the programmable logic chip. A clock skew of the programmable logic chip can be adjusted by adjusting the regional clock of each chip region to the target delay, such that the programmable logic chip can work in a desired clock skew mode.

The clock skew mode of the programmable logic chip in the present disclosure includes at least one of a zero-skew mode, a lead skew mode, and a lag skew mode.

(1) The zero-skew mode is a clock skew mode in which the phases of the clock signals of all clock loads with different distances from the clock source are the same.

For example, in the structure shown in FIG. 2, the chip clock architecture includes one global clock and seven regional clocks, namely, regional clocks 0 to 6. Regional clocks 0 and 2 are located above the horizontal position of the clock source and their distances from the clock source gradually decrease. Regional clock 3 is at the same horizontal position as the clock source. Regional clocks 4 to 6 are located below the horizontal position of the clock source and their distances from the clock source gradually increase. A delay value of the global clock between any two adjacent different chip regions is $T_{RE}$.

It is assumed that delay adjustment cells 0 to 6 are disposed between the seven regional clocks and the global clock, respectively. Delay paths contained in the seven delay adjustment cells have identical structures. Each of the seven adjustment cells is internally provided with delay paths R0 to R7, and delays generated by the delay paths R0 to R7 are 0, $T_{RE}$, $2T_{RE}$, $3T_{RE}$, $4T_{RE}$, $5T_{RE}$, $6T_{RE}$, and $7T_{RE}$, respectively.

Delays of different regional clocks in longitudinal transmission can be compensated by gating delay paths R0 inside delay adjustment cells 0 and 6, delay paths R1 inside delay adjustment cells 1 and 5, delay paths R2 inside delay adjustment cells 2 and 4, and the delay path R3 inside delay adjustment cell 3. In this way, the clock skew of the chip can be adjusted to a relatively small value without being affected by an increase of regions, such that the chip works in the zero-skew mode.

(2) The lead skew mode is a clock skew mode in which the clock signal of the clock load that is farther away from the clock source has a larger leading phase.

Based on the example in the zero-skew mode, the lead skew mode can be realized by gating the delay paths R0 inside delay adjustment cells 0 and 6, the delay paths R2 inside delay adjustment cells 1 and 5, the delay paths R4 inside delay adjustment cells 2 and 4, and the delay path R6 inside delay adjustment cell 3.

(3) The lag skew mode is a clock skew mode in which the clock signal of the clock load that is farther away from the clock source has a larger lagging phase.

Based on the example in the zero-skew mode, the lead skew mode can be realized by gating delay paths R0 inside delay adjustment cells 0 to 6.

In addition, when any clock skew mode is realized, a specific value of the target delay of each of the regional clocks may also be different, and configuration information of the corresponding delay adjustment cell may also be different, which is flexible and adjustable. For example, in the lag skew mode, the lead skew mode may alternatively be realized by gating delay paths R1 inside delay adjustment cells 0 to 6, but the seven regional clocks have different target delays.

The delay adjustment cell obtains the configuration signal in primarily two ways.

(1) The delay adjustment cell parses an externally input configuration code stream of the programmable logic chip to obtain the configuration signal, that is, a user configures the delay adjustment cell based on the external configuration code stream to generate the desired delay and realize the desired clock skew mode.

(2) The chip clock architecture further includes a configuration signal generation unit implemented by a resource in the programmable logic chip, where the configuration signal generation unit generates the configuration signal corresponding to the clock skew mode of the programmable logic chip and provides the configuration signal to the delay adjustment cell. Specifically, the configuration signal generation unit generates the configuration signal for each delay adjustment cell based on the layout position of a predetermined feedback terminal of each of the regional clocks and a clock signal fed back by the predetermined feedback terminal, as well as the target delay of each of the regional clocks.

There are generally two typical cases for the predetermined feedback terminal: (1) An input terminal of the delay adjustment cell of each of the regional clocks is taken as the predetermined feedback terminal. In this case, based on the architecture in which the delay adjustment cell is disposed at the junction between the global clock and the regional clock, the signal fed back by the predetermined feedback terminal is an input signal provided by the global clock to each of the regional clocks. (2) A clock terminal of one of the clock loads connected to the regional clock is taken as the predetermined feedback terminal.

No matter how the predetermined feedback terminal is set, the configuration signal generation unit can generate the configuration signal for each delay adjustment cell based on the target delay of each of the regional clocks. For example, corresponding to FIG. 2, a clock signal at an input terminal of cell 0 is denoted as T0, and a clock signal at an input terminal of cell 3 is denoted as T1. Based on the layout positions of cell 0 and cell 3, it can be determined that the distance between cell 0 and the clock source is greater than that between cell 3 and the clock source. Therefore, the configuration signals of cell 0 and cell 3 can be generated to gate the delay path R0 with a small delay value inside cell 0 and the delay path R6 with a large delay value inside the delay adjustment cell 3, such that clock signals of cell 0 and cell 3 have the same phase.

One clock tree may correspond to one configuration signal generation unit. The configuration signal generation unit obtains the layout position of the predetermined feedback terminal of each of the regional clocks and the clock signal fed back by the predetermined feedback terminal and generates the configuration signal for the delay adjustment cell connected to each of the regional clocks. Alternatively, each delay adjustment cell corresponds to one configuration signal generation unit. The configuration signal generation unit obtains a layout position of a predetermined feedback terminal of a connected regional clock and a clock signal fed back by the predetermined feedback terminal as well as layout positions of predetermined feedback terminals of other regional clocks and clock signals fed back by the predetermined feedback terminals and generates a corresponding configuration signal for the configuration signal generation unit.

Optionally, in another embodiment, considering low power consumption and different utilization of clock resources in different application scenarios, the delay adjustment cell further includes an enable terminal EN configured to receive an enable signal. The enable signal is generated based on the usage of a resource of the chip region corresponding to the regional clock connected to the delay adjustment cell, and this operation can be completed by the resource in the programmable logic chip. When the resource of the chip region corresponding to the regional clock connected to the delay adjustment cell is used, an enable signal with a valid level is generated. When receiving the enable signal with the valid level, the delay adjustment cell gates one of the delay paths based on the obtained configuration signal to adjust the delay and the clock skew, as described in the above process. When the resource of the chip region corresponding to the regional clock connected to the delay adjustment cell is not used, an enable signal with an invalid level is generated. When receiving the enable signal with the invalid level, the delay adjustment cell turns off all the delay paths to reduce the power consumption of the chip.

Figure 4:
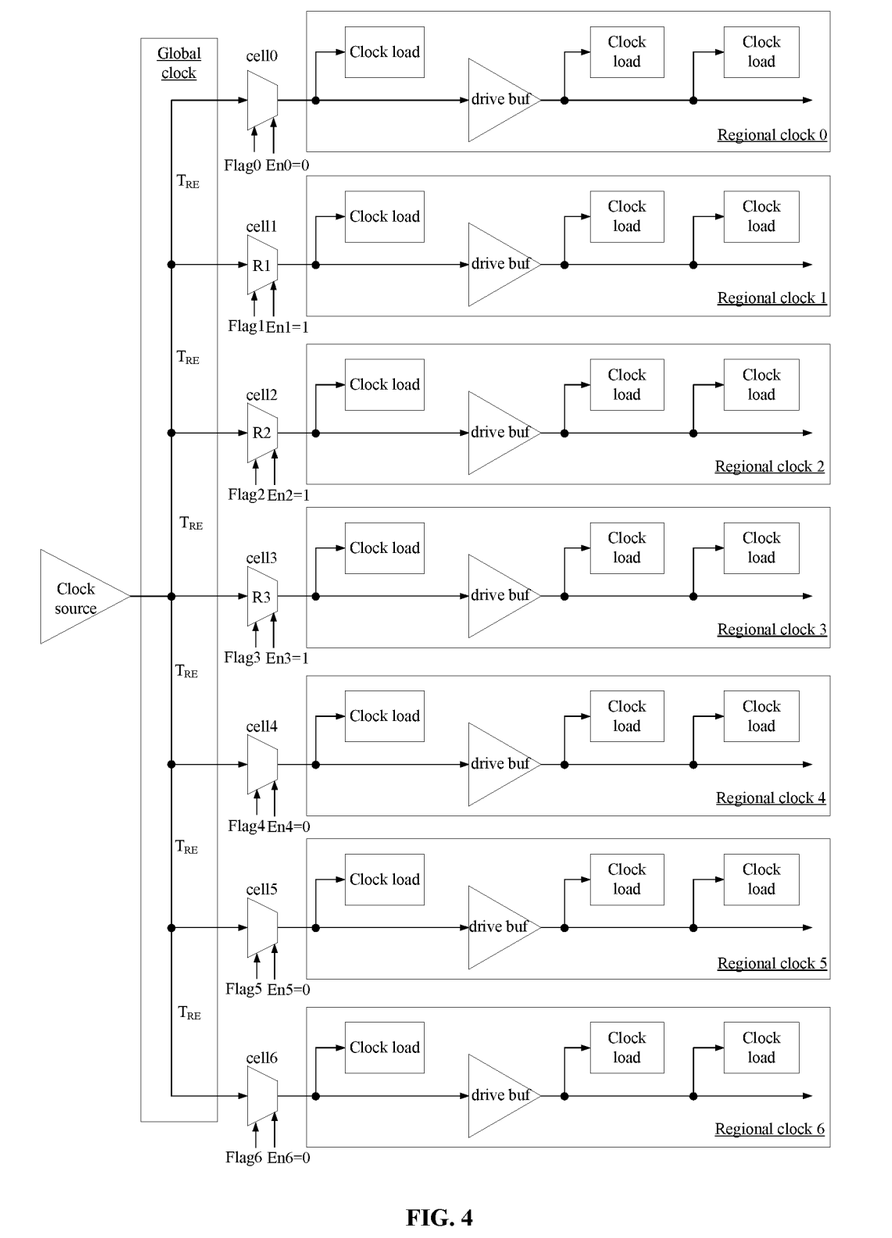
FIG. 4 is a schematic diagram of a configuration gating of a chip clock architecture as an example.

In an example, based on the structure in FIG. 2, as shown in FIG. 4, it is assumed that only clock loads of chip regions of regional clocks 1, 2, and 3 need to be used in a scenario, clock loads of other chip regions are not used, and the zero-skew mode needs to be realized. In this case, delay adjustment cells 0, 4, 5, and 6 receive the enable signal with the invalid level and are turned off. It is assumed that a low level is invalid. Delay adjustment cells 1, 2, and 3 receive the enable signal with the valid level. In addition, delay adjustment cell 1 gates the internal delay path R1 based on the configuration signal, delay adjustment cell 2 gates the internal delay path R2 based on the configuration signal, and delay adjustment cell 3 gates the internal delay path R3 based on the configuration signal.

The above merely describes preferred implementations of the present disclosure, and the present disclosure is not limited to the above embodiments. It can be understood that improvements and modifications directly derived or associated by those skilled in the art without departing from the spirit and concept of the present disclosure should be regarded as falling within the protection scope of the present disclosure.

What is claimed is:

1. A clock skew-adjustable chip clock architecture of a programmable logic chip, comprising a global clock and regional clocks, wherein
   a clock input terminal of the global clock is connected to a clock source, a clock output terminal of the global clock is separately connected to a clock input terminal of each of the regional clocks, and each of the regional clocks is connected to a clock load of a corresponding chip region of each of the regional clocks and provides a clock signal;
   a delay adjustment cell is disposed in a channel of at least one of the regional clocks, the delay adjustment cell comprises parallel delay paths with different delay values, the delay adjustment cell gates one of the parallel delay paths based on a configuration signal such that a connected regional clock has a corresponding target delay, and a target delay of each of the regional clocks corresponds to a clock skew mode of the programmable logic chip; and
   any $i^{th}$ delay path of the delay adjustment cell comprises one gating buffer and i delay buffers, and the gating buffer and the i delay buffers are cascaded, wherein i is a parameter with a starting value of 0; and the delay adjustment cell controls, based on the configuration signal, one gating buffer to be turned on and the other gating buffers to be turned off to gate a delay path, wherein the gating buffer to be turned on is located in the delay path.

2. The clock skew-adjustable chip clock architecture according to claim 1, wherein the clock skew mode of the programmable logic chip comprises at least one of a zero-skew mode, a lead skew mode, and a lag skew mode; wherein
   in the zero-skew mode, phases of clock signals of all clock loads with different distances from the clock source are the same,
   in the lead skew mode, a clock signal of a clock load that is farther away from the clock source has a larger leading phase, and
   in the lag skew mode, a clock signal of a clock load that is farther away from the clock source has a larger lagging phase.

3. The clock skew-adjustable chip clock architecture according to claim 1, wherein
   the delay adjustment cell parses an externally input configuration code stream of the programmable logic chip to obtain the configuration signal; or
   the clock skew-adjustable chip clock architecture further comprises a configuration signal generation unit implemented by a resource in the programmable logic chip, wherein the configuration signal generation unit generates the configuration signal corresponding to the clock skew mode of the programmable logic chip and provides the configuration signal to the delay adjustment cell.

4. The clock skew-adjustable chip clock architecture according to claim 1, wherein the delay adjustment cell further comprises an enable terminal, and gates one of the parallel delay paths based on the configuration signal when receiving an enable signal with a valid level, or turns off all the parallel delay paths when receiving an enable signal with an invalid level, wherein
   the enable signal of the delay adjustment cell has the valid level when a resource of a chip region corresponding to the regional clock connected to the delay adjustment cell is used, and
   the enable signal of the delay adjustment cell has the invalid level when the resource of the chip region corresponding to the regional clock connected to the delay adjustment cell is not used.

5. The clock skew-adjustable chip clock architecture according to claim 1, wherein a delay change value of an $(i+1)^{th}$ delay path relative to the $i^{th}$ delay path is a delay value generated by one delay buffer, and delay values generated by all delay buffers in the delay adjustment cell are equal and consistent with a delay value $T_{RE}$ of the global clock between two adjacent different chip regions.

6. The clock skew-adjustable chip clock architecture according to claim 5, wherein the global clock is a vertically wired longitudinal clock, each of the regional clocks is a horizontally wired transverse clock, the delay value $T_{RE}$ of the global clock between the two adjacent different chip regions is a delay value of the global clock in a longitudinal height of a chip region corresponding to one regional clock, and if longitudinal heights of chip regions corresponding to the regional clocks are the same, delay values generated by all single delay buffers in all delay adjustment cells are equal.

7. The clock skew-adjustable chip clock architecture according to claim 1, wherein any two delay adjustment cells comprise a same quantity or different quantities of delay paths, and combinations of all delay values generated by the any two delay adjustment cells are the same or different.

8. The clock skew-adjustable chip clock architecture according to claim 1, wherein the global clock is connected to each of the regional clocks by using the delay adjustment cell, and the global clock is connected to the at least one of the regional clocks by using a plurality of cascaded delay adjustment cells.

9. A clock skew-adjustable chip clock architecture of a programmable logic chip, comprising a global clock and regional clocks, wherein a clock input terminal of the global clock is connected to a clock source, a clock output terminal of the global clock is separately connected to a clock input terminal of each of the regional clocks, and each of the regional clocks is connected to a clock load of a corresponding chip region of each of the regional clocks and provides a clock signal;

a delay adjustment cell is disposed in a channel of at least one of the regional clocks, the delay adjustment cell comprises parallel delay paths with different delay values, the delay adjustment cell gates one of the parallel delay paths based on a configuration signal such that a connected regional clock has a corresponding target delay, and a target delay of each of the regional clocks corresponds to a clock skew mode of the programmable logic chip;

the clock skew-adjustable chip clock architecture further comprises a configuration signal generation unit implemented by a resource in the programmable logic chip, wherein the configuration signal generation unit generates the configuration signal corresponding to the clock skew mode of the programmable logic chip and provides the configuration signal to the delay adjustment cell; and the configuration signal generation unit generates the configuration signal for each delay adjustment cell based on a layout position of a predetermined feedback terminal of each of the regional clocks and a clock signal fed back by the predetermined feedback terminal and the target delay of each of the regional clocks.

* * * * *